US005513079A

United States Patent [19]
Millard

[11] Patent Number: 5,513,079
[45] Date of Patent: Apr. 30, 1996

[54] MASS TERMINATION OF SIGNALS FROM ELECTRONIC SYSTEMS TO DEVICES UNDER TEST

[75] Inventor: Robert A. Millard, Loveland, Colo.

[73] Assignee: Hewlett-Packard Co., Palo Alto, Calif.

[21] Appl. No.: 369,823

[22] Filed: Jan. 6, 1995

[51] Int. Cl.$^6$ ........................................... H05K 9/00
[52] U.S. Cl. .................. 361/823; 361/759; 361/801; 361/798; 211/41; 174/17 R
[58] Field of Search ............................ 362/752, 754, 362/756, 759, 796, 798, 801, 802, 825, 823; 248/65, 121, 127; 455/90, 347; 211/41; 439/152–159, 160; 403/16, 321, 330; 174/17 R

[56] References Cited

U.S. PATENT DOCUMENTS

| | | | |
|---|---|---|---|
| 4,603,375 | 7/1986 | Miller et al. | 361/399 |
| 4,893,405 | 1/1990 | Pennington | 29/857 |
| 4,996,631 | 2/1991 | Grechauf | 361/391 |
| 5,103,378 | 4/1992 | Stowers et al. | 361/415 |
| 5,168,171 | 12/1992 | Tracewell | 307/64 |
| 5,175,536 | 12/1992 | Aschliman et al. | 340/825.04 |
| 5,285,353 | 2/1994 | Buck et al. | 361/732 |
| 5,396,401 | 3/1995 | Nemoz | 361/690 |
| 5,398,164 | 3/1995 | Goodman et al. | 361/752 |
| 5,432,682 | 7/1995 | Giehl et al. | 361/796 |

OTHER PUBLICATIONS

Hewlett–Packard, "HP75000 Family of VXI Products and Services Catalog," 1994, 8 pages (pp. 12.1–12.6).
Hewlett–Packard, "1993 Test And Measurement Catalog", 14 pages (pp. 75–87).
Hewlett–Packard, "1994 Test And Measurement Catalog", 15 pages (pp. 67–80).
Hewlett–Packard, "1995 Test And Measurement Catalog", 7 pages (pp. 79–89).

Primary Examiner—Leo P. Picard
Assistant Examiner—Y. Whang
Attorney, Agent, or Firm—Cynthia S. Baan

[57] ABSTRACT

An improved terminal block for permitting the connection of inputs and outputs of an electronics mainframe module, such as a VXI mainframe module, to external devices, such as devices under test. The improved terminal block includes insertion and ejection levers to ease the connection and disconnection of the terminal block to the module. A ledge of the insertion and ejection lever engages an insertion beating surface on a front panel of the module during the insertion process and is then rotated in the appropriate direction until the terminal block is securely connected to the module. The ledge of the insertion and ejection lever engages an ejection beating surface on the front panel of the module during the ejection process and is then rotated in the appropriate direction until the terminal block is disengaged from the module. The levers can also be shaped in such a manner to permit top and bottom cable routing apertures, as well as a back side cable routing aperture.

11 Claims, 15 Drawing Sheets

MASS TERMINATION OF SIGNALS FROM ELECTRONIC SYSTEMS TO DEVICES UNDER TEST

FIELD OF THE INVENTION

The present invention relates generally to the field of electrical connection systems and techniques and more particularly to systems for connecting electrical test equipment to apparatus which is being tested. In particular, this invention provides an improved system and technique for quickly and efficiently connecting and disconnecting a plurality of electrical connectors to printed circuit cards contained in a mainframe card cage.

BACKGROUND OF THE INVENTION

In the electronics industry, printed circuit boards are often interconnected in card cages or mainframes that include mounting hardware and electrical connections for receiving the printed circuit boards. A typical system is a VXI mainframe and corresponding printed circuit (PC) board modules, which have been standardized by the VXIbus Consortium, Inc. for interchangeability among different vendors. Generally, the printed circuit boards are housed in modules which slide in and out of all vendor's mainframes with the electrical connections between the various modules being made by electrical plug-in connectors at the back of the printed circuit boards and corresponding electrical connectors at the back of the mainframe.

This type of electrical connection between the printed circuit board module and the 20 mainframe is more fully described in related U.S. patent application Ser. No. 08/369,070, filed Jan. 5, 1995 to Arnold Joslin, entitled IMPROVED INJECT-EJECT SYSTEM FOR RACK MOUNTED PLUG-IN MODULES, which is hereby incorporated by reference for all that it teaches. Generally, several modules (approximately 6–13) are inserted side-by-side into a mainframe with relatively little space between the individual modules (approximately 0.012 inches). Typically, if the PC module is to be utilized with external devices, a connector or terminal block is connected to electrical pin connectors at the front end of the PC module.

FIG. 1 shows a printed circuit module 100 with two electrical connectors 110 that include male connector pins 112. There are also similar connectors 111 at the back of module 100, which are used to connect module 100 to a mainframe (not shown). Also shown is a typical connector or terminal block 102, which is used to connect the inputs and outputs (I/O) of module 100 to external devices, such as devices under test. Terminal block 102 has two electrical connectors 114, which include female connector holes (not shown) that mate with to the male connector pins 112 of connectors 110. Terminal block 102 further includes a printed circuit board 104 (shown disengaged from terminal block 102) with connectors 106 that permit interconnection between connectors 114 and external wiring, which is routed through cable routing aperture 108 to devices under test.

Terminal block 102 is typically connected to module 100 by an operator applying physical force to the back wall 118 of terminal block housing 102 until connectors 114 and 112 are mated. Terminal block 102 is then secured to module 100 by means of small screws used to secure attachment member 116 to attachment block 120. External connection wires (not shown) are connected to printed circuit board 104 (inside terminal block housing 102) and then routed through cable routing aperture 108. Terminal block housing 102 is typically made of a hard plastic material.

The current trend in the industry is to increase the I/O signal count from module 100 to the device under test, which means that the connectors 112 and 114 can now have between 96 and 320 or more connector pins. This corresponds to an insertion and removal force of approximately 24 to 75 or more pounds. As terminal block 102 does not have alignment guides for mating with the printed circuit module, the connector pins 112 of connectors 110 and the corresponding holes in connectors 114 are used as alignment guides, which may cause many connector pins 112 to be damaged. A similar problem with terminal blocks of the prior art is that there is no way to insure that the force applied by the operator is applied in a uniform manner, so that there is no angular misalignment between connectors 114 or 106 in the terminal housing 102 and connectors 110 in module 100. Furthermore, the plastic housing of terminal block 102 is frequently damaged due to operators applying upwards of 75 pounds of force to the back wall 118 in order to connect terminal block 102 to module 100.

It should also be noted that most mainframe card cages are mounted on wheels. This fact in combination with the 24 to 75 pounds of insertion and extraction force applied to the front of the module can result in the mainframe being pushed across the floor or may require more than one operator to insert or extract the terminal block from the module—one to push on the terminal block at the front of the mainframe and one to secure the mainframe against movement.

Another dilemma caused by the increase in I/O's is routing 96 to 320 or more wires through the small cable routing aperture 108. The routing of too many wires through cable routing aperture 108 causes excessive stress on the plastic housing of terminal block 102, which can result in the cracking or breaking of the housing. Also, routing too many wires through cable routing aperture 108 may cause the sides of the housing of terminal block 102 to bend outward, potentially interfere with neighboring modules and terminal blocks in the mainframe (not shown). It is not feasible to increase the size of cable routing aperture 108 and maintain the structural rigidity necessary for the terminal block housing 102. It is also not feasible to route wire through top and bottom walls 122 of terminal block 102 with the current configuration of typical terminal blocks, as the attachment of attachment member 116 to attachment block 120 requires a tool, such as a screw driver, to secure the attachment of terminal block 102 to module 100 in the area that wires would exit from terminal block along the top and bottom walls 122. It is further not feasible to route wire through the sides of the terminal block housing, as this would interfere with immediate neighboring modules and terminal blocks.

A further problem with the prior art terminal block 102 is that an operator may inadvertently insert, or attempt to insert, the terminal block into the printed circuit board module 100 upside down. This may result in the connector pins 112 being bent or broken. Worse yet, if the terminal block is successfully inserted upside down, the electronics of the device under test, the module or the mainframe may be damaged.

Accordingly, it would be a substantial improvement in the field to provide a termination block for signals from electronic systems such as VXI modules to devices under test that overcomes the disadvantages of existing systems, such as the application of misaligned force to connector pins during the insertion process, the application of excessive force to the terminal block housing during the insertion process, the bending outward or breaking of the terminal block housing due to routing too many wires through a single cable routing aperture. It would be a further advantage to provide a terminal block that has easier insertion, attachment and removal processes than the terminal blocks of the prior art. It would be yet a further advantage to provide a terminal block that cannot be inserted into a printed circuit board module in an inverted position.

SUMMARY OF THE INVENTION

The above and other disadvantages of the prior art are overcome by the present invention, which includes a terminal block with insertion and ejection levers at top and bottom ends of the terminal block. The levers engage insertion bearing surfaces of insertion guides that are attached to top and bottom edges of a front panel of a printed circuit board module. Once the insertion bearing surfaces are engaged, the top lever is rotated downward and the bottom lever is simultaneously rotated upward until the terminal block connectors and the printed circuit board module connectors are mated. Ejection is performed by rotating the top lever upward and the bottom lever downward as ejection bearing surfaces on insertion guides are engaged by the top and bottom levers. The insertion guides and the terminal block housing may include matingly keyed surfaces that prevent the terminal block from being inserted into the module upside down. Top and bottom levers may also be shaped in such a manner to leave the top and bottom walls of the terminal block clear, thus permitting the top and bottom walls to be used as wire routing paths to external devices under test.

DETAILED DESCRIPTION OF THE PREFERRED EMBODIMENT

Figure 1:
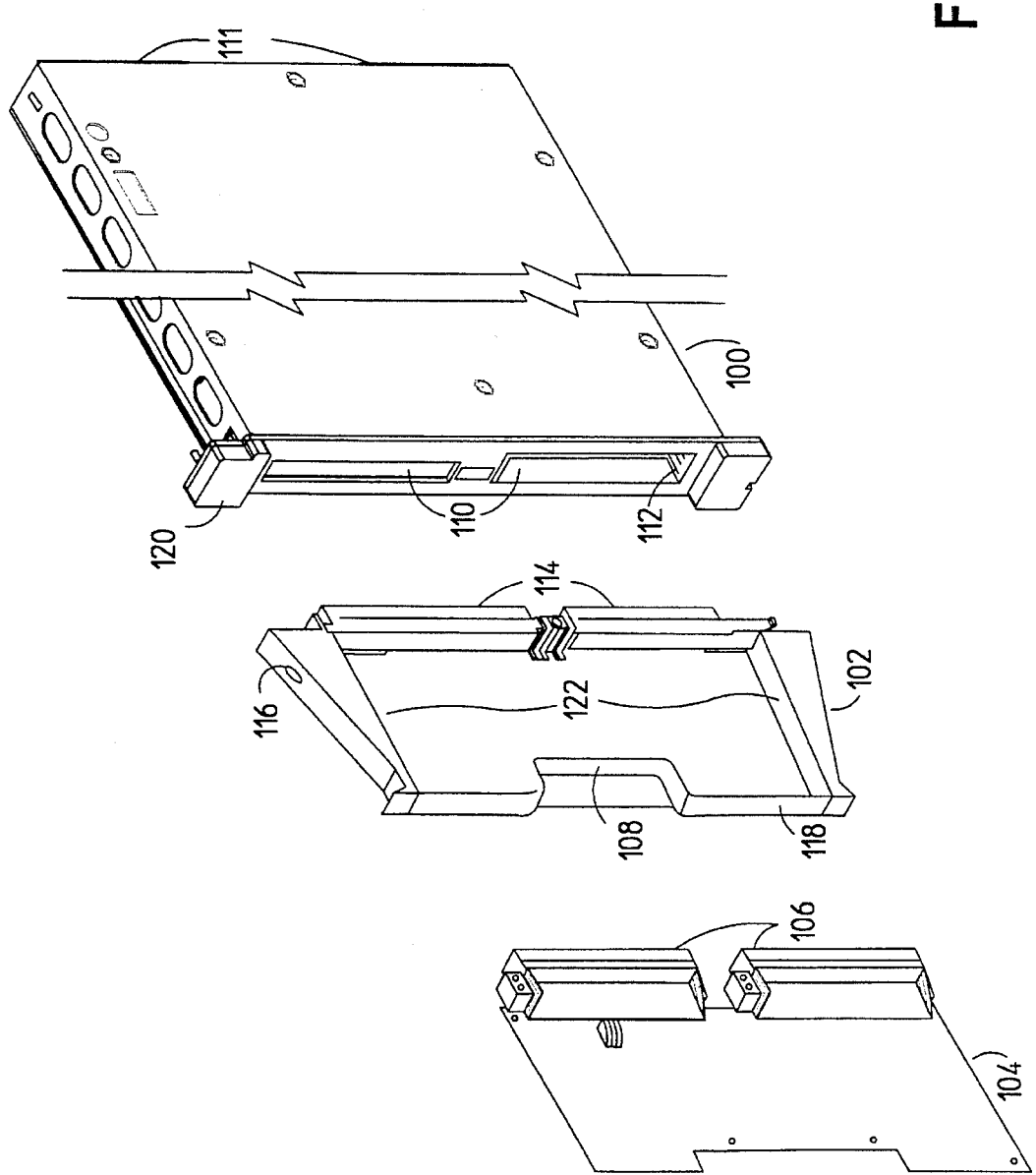
FIG. 1 shows an exploded, perspective view of a typical terminal block disengaged from a printed circuit board module.
Figure 2:
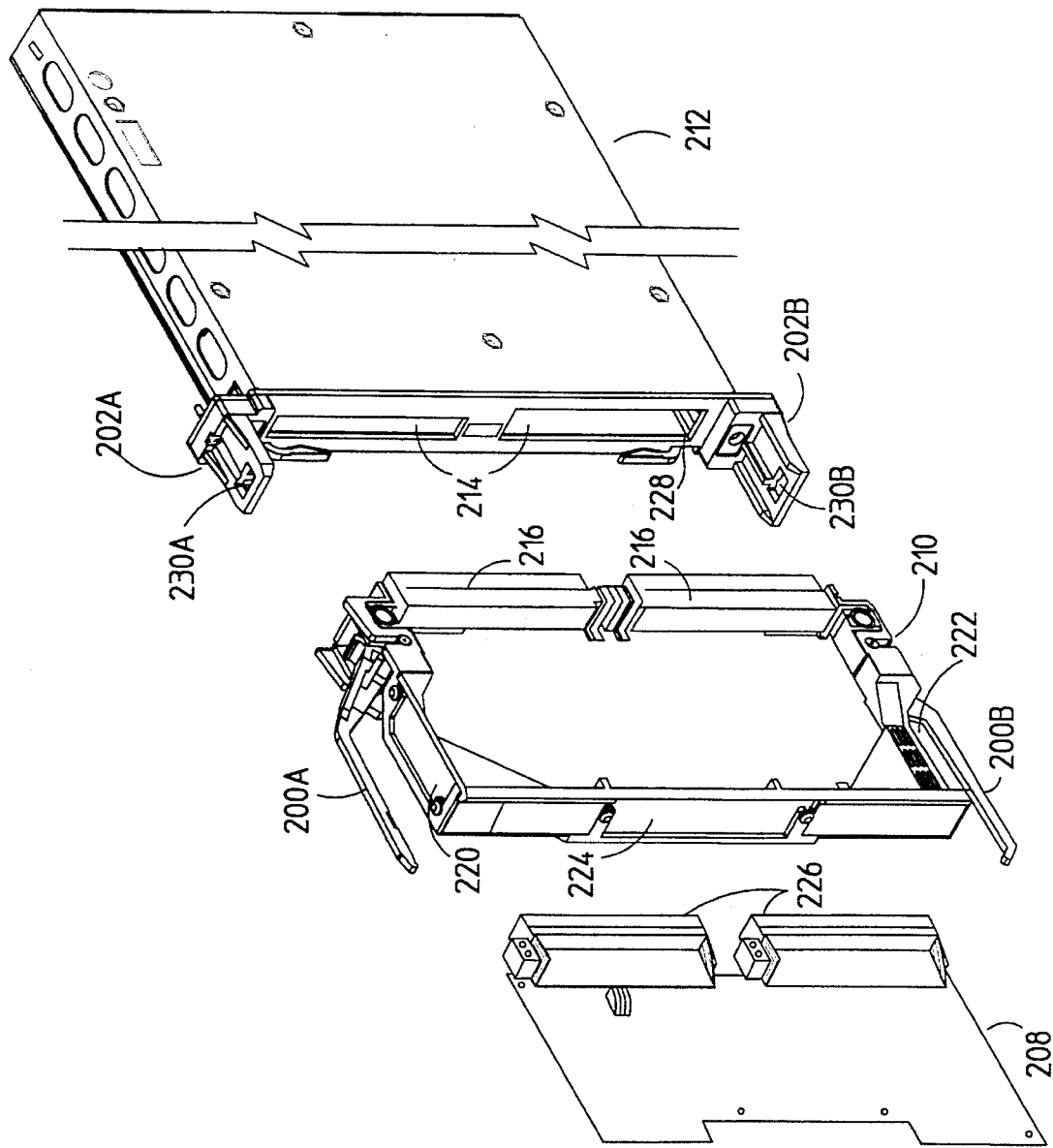
FIG. 2 shows an exploded, perspective view of a terminal block and a VXI printed circuit board module according to the present invention.

FIG. 2 shows printed circuit module 212 with two electrical connectors 214 that include male connector pins 228. Also shown is a connector or terminal block 210 according to the present invention, which is used to connect the inputs and outputs (I/O) of module 212 to external devices, such as devices under test. Terminal block 210 has two electrical connectors 216, which include female connector holes (not shown) that matingly correspond to the male connector pins 228 of connectors 214. Terminal block 210 has levers 200A and 200B at top and bottom surfaces, respectively, for permitting an operator to obtain insertion and ejection leverage. Printed circuit board module 212 includes insertion guides 202A and 202B, which have slots 230A and 230B to be used as insertion and ejection bearing surfaces by levers 200A and 200B, respectively.

Terminal block 210 can also include a printed circuit board 208 that is snapped or installed onto guide pins (not shown) in terminal housing 210 (shown in a disengaged position) with connectors 226 that permit interconnection between connectors 216 and external wiring. Connectors 226 can be any known wiring connectors, such as screw terminals, soldering terminals, or screwless spring clamp terminals. Terminal block 210 further includes cable routing apertures 220, 222, and 224 (shown with optional blank shields). Blank shields may be used to cover any unused wire routing apertures in order to provide EMI shielding and/or extra structural support to the terminal block housing. It will be noted (as will be elaborated more fully with reference to FIG. 5–13) that levers 200A and 200B are shaped in such a manner as to avoid interference with wires routed from top and bottom apertures 220 and 222.

Features 218 are inward steps in the terminal housing 210 that are substantially the same height as the thickness of levers 200A and 200B. Accordingly, when levers 200A and 200B are in a fully locked position, the outer surface of the housing and the levers are substantially planar (see FIGS. 5 and 7–9), and thus, there is no interference with neighboring terminal blocks or modules. Step 218 also functions to reinforce the corners of terminal housing 210 between wire routing apertures 220, 222 and 224.

Figure 3:
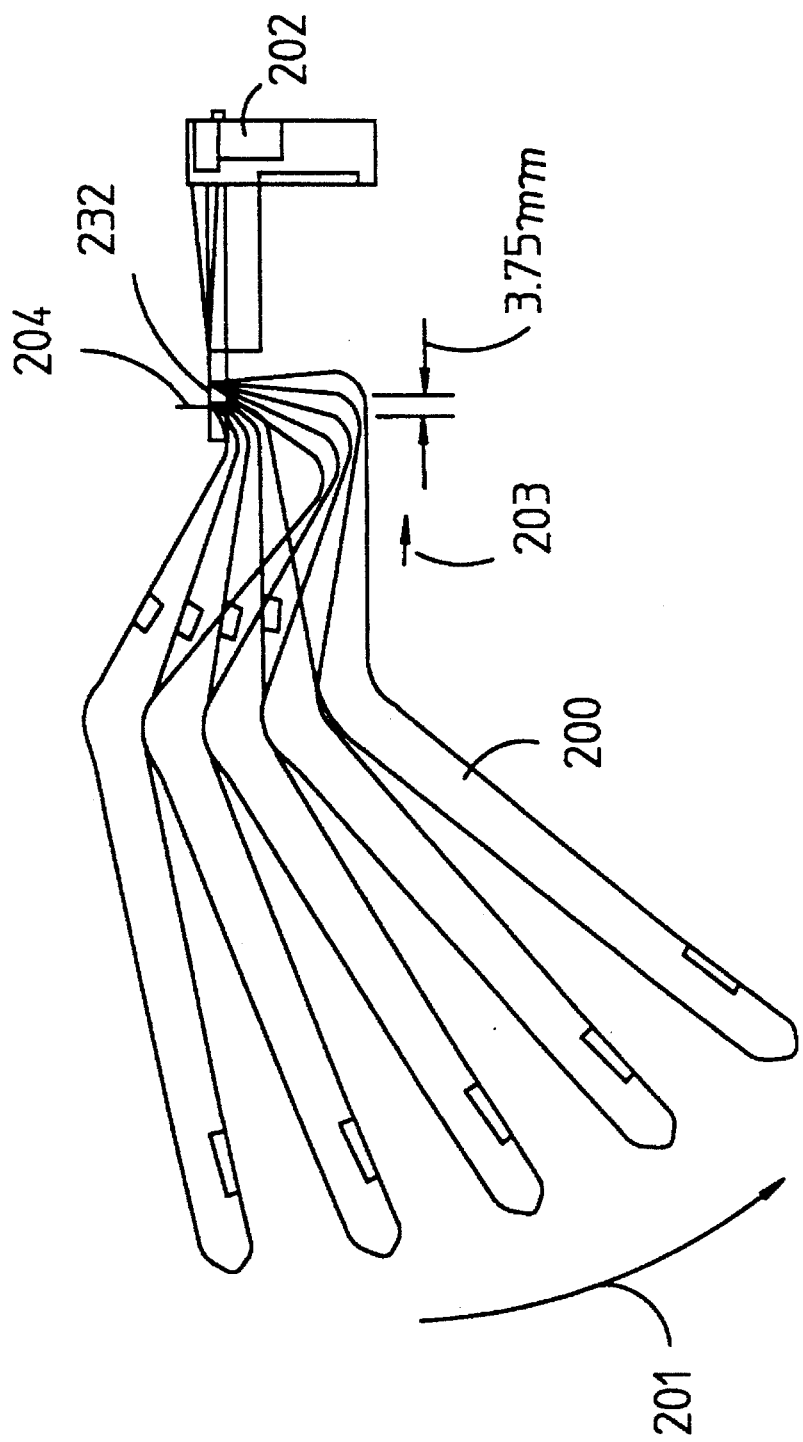
FIG. 3 shows a side perspective view of a lever and an insertion guide depicting the insertion motion of the lever according to the present invention.
Figure 4:
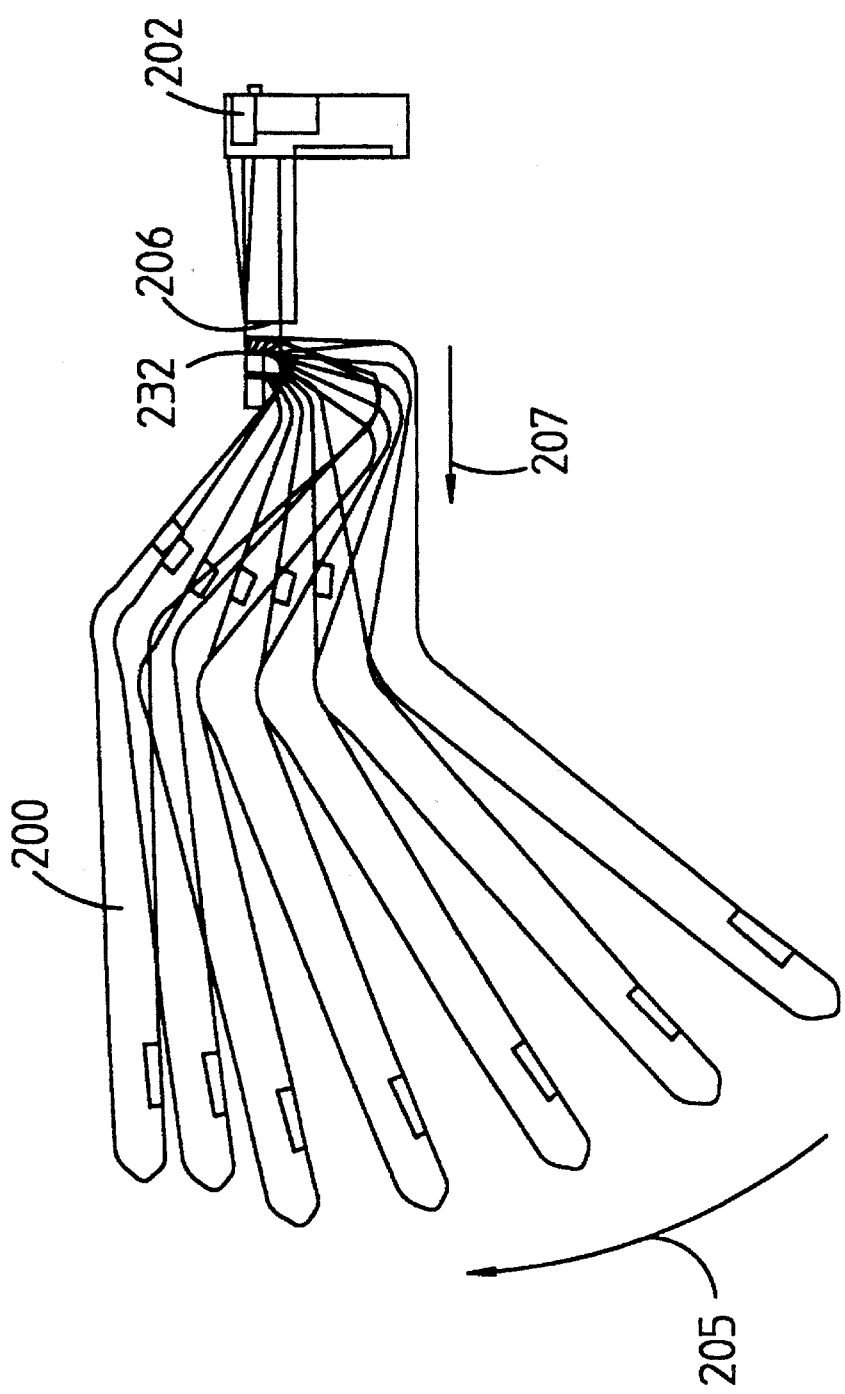
FIG. 4 shows a side perspective view of a lever and an insertion guide depicting the ejection motion of the lever according to the present invention.

The insertion and ejection processes are described with reference to FIGS. 2–4. It should be noted that FIGS. 3 and 4 only depict lever 200A and insertion guide 202A, however, as the top and bottom levers and insertion guides are inverses of each other, it will be appreciated that teaching the structure and procedure for one side also teaches the structure and procedure for the opposite side.

To insert connectors 216 of terminal block 210 into connectors 214 of module 212, an operator guides terminal block 210 into a position in which insertion guides 202A and 202B are slidably mated with terminal guides 234A and 234B, respectively. At this point, levers 200A and 200B should be in an open position as shown in FIG. 2. As the operator slides terminal block 210 onto insertion guides 202A and 202B, a ledge 232 (FIGS. 3 and 4) on the levers will catch an insertion bearing surface 204 in slot 230 of insertion guides 202. Once the levers engage the insertion bearing surface 204, the operator then rotates top lever 200A downward (arrow 201 in FIG. 3) and bottom lever 200B upward (not shown) until terminal connectors 216 and module connectors 214 are mated. From the point that the levers engage the insertion bearing surface 204 until the terminal block connector 216 is fully inserted, the terminal block will travel approximately 3.75mm along a linear path shown by arrow 203 in FIG. 3.

The ejection process is the reverse of the insertion process. Specifically, the operator rotates top lever 200A upward as depicted by arrow 205 in FIG. 4 and bottom lever 200B downward (not shown). As this rotation occurs, ledge 232 on either lever will engage ejection bearing surface 206 of insertion guides 202 (FIG. 4). Once the levers engage the ejection bearing surface 206, the operator continues rotating the top lever upward and the bottom lever downward and the terminal block moves along a linear path as depicted by arrow 207 in FIG. 4 until connectors 216 of terminal block 210 are disengaged from connector pins 228 of connectors 214 on module 212.

Figure 5:
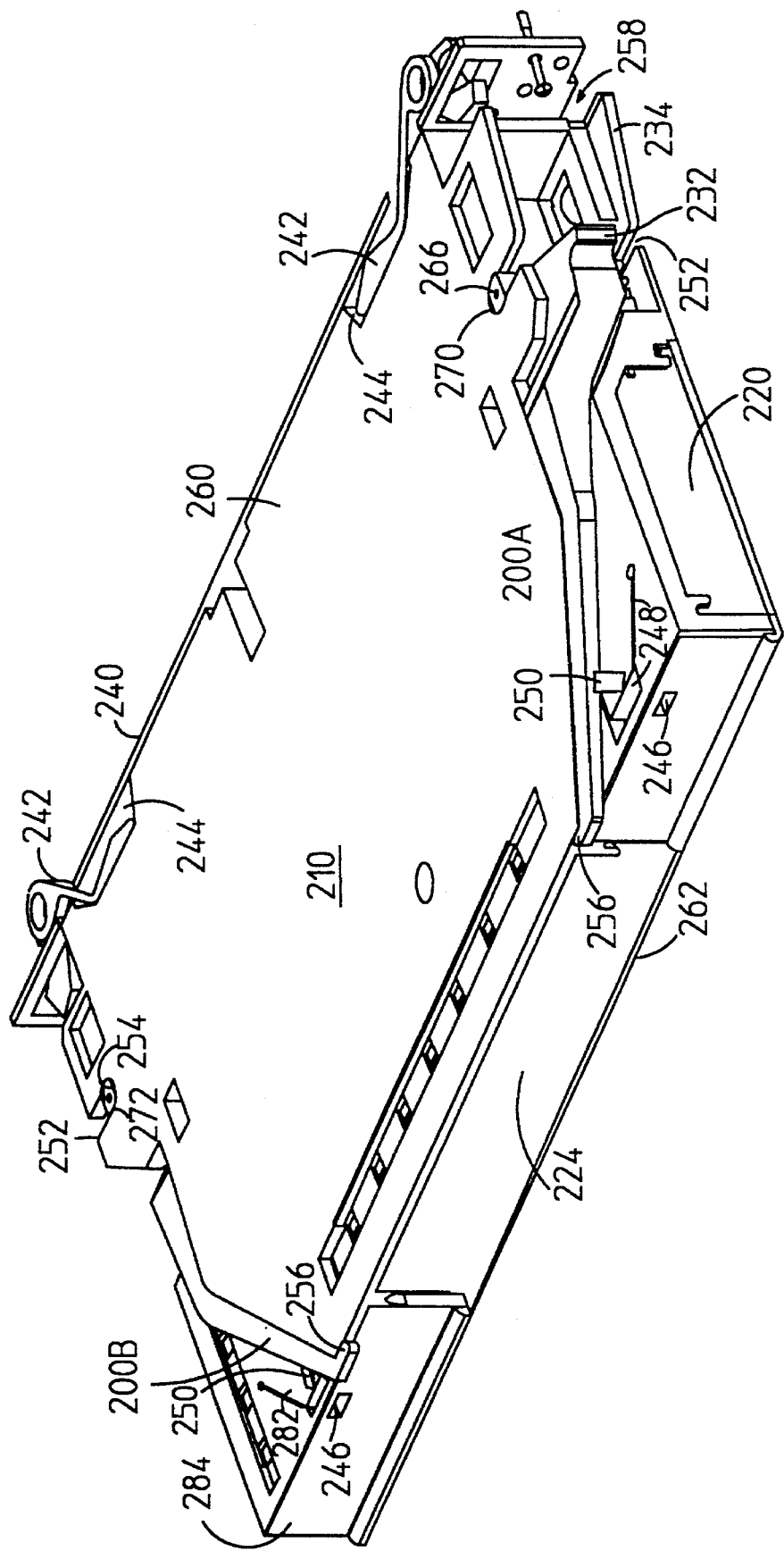
FIG. 5 shows a top side, perspective view of a terminal block according to the present invention.

Reference will now be made to FIGS. 5–9 wherein the features of terminal block 210 will be described in greater detail. FIG. 5 shows a top perspective view of terminal block 210 with cable routing apertures 220 and 224 in view and cable routing aperture 222 obscured by terminal block top 260. Ledge 232 of lever 200A is shown in greater detail. The manner in which levers 200A and 200B are rotatably attached to terminal block 210 can also be appreciated in FIG. 5. Specifically, levers 200 rotate about axis member 266, which has two parallel, opposing flat sides 254 and two opposing circular sides 272. Terminal top 260 and terminal bottom 262 each have slots 252 ending in semi-circular lever stops 270. The width of axis member 266 between flat sides 254 is slightly less than the width between the sides of slot 252 and the radius of circular sides 272 is slightly less than the radius of semi-circular lever stops 270. Accordingly, to attach the levers 200 to terminal block 210, the flat sides 254 of axis member 266 are lined-up with the slots 252 of terminal block 210. The axis member is then inserted into slots 252 until the axis member reaches the semi-circular lever stops 270. The lever arm is then rotates causing the circular sides 272 of axis member 266 to engage semi-circular lever stops 270. The lever cannot slide out of this position because the circular sides 254 of the axis member 266 are wider than slots 252.

The levers may alternatively be attached to terminal block 210 by providing a hole (not shown) on either of the top or bottom surfaces of terminal block housing 210 and slots 252 ending in semi-circular stops 270 on the opposite surface of terminal block housing 210. To insert the lever in the alternative manner, one end of lever axis member 266 is inserted into the hole and then the opposite end of lever axis member 266 is slid into slot 252 until it reaches semi-circular stop 270, at which point the lever is then rotatably locked into place.

An optional feature in a preferred embodiment includes locking members 250, which lock levers 200 into place when the connectors 216 of terminal block 210 are fully inserted into the connectors 214 of module 212. As can be seen in FIG. 5, the top surface of cover 260 of terminal block 210 is stepped in the corners where levers 200 nestle; the step height being approximately equal to the thickness of levers 200. This permits levers 200 to rest on top cover 260 without increasing the thickness of terminal block 210, and thus, not interfering with any immediate neighbor modules or terminal blocks in the mainframe (not shown).

Locking members 250 are preferably ramped such that levers 200 will easily slide into the locked position. Locking members 250 are integral with the top cover 260 and have a slot 248 extending around three sides of locking members 250, thus creating a flexible arm 282 that can be depressed with an operator's finger or by inserting a tool such as a screw driver through an adjacent hole 246 in back wall 284 of terminal block housing in order to release the lever from the locked position.

Another improvement in a preferred embodiment would include grasping knobs 256 at the end of levers 200, giving the operator a better grasp on the lever than a merely straight lever would permit. Yet another embodiment could include a torsion spring (not shown) near the rotational axis member 266. The torsion spring would be slightly loaded when the lever is in the locked position. Accordingly, when the locking member 250 is depressed and the lever is released, the lever will rotate away from the locked position enough for the operator to get his/her finger tips under the edge of grasping knob 256. Grasping knobs 256 preferably have a knurled or rough, non-slip surface to prevent the operator's fingers from slipping off during the insertion and extraction procedures.

FIG. 5 shows front panel 240 and inject/eject levers 242 of module 212. Inject/eject levers 242 of module 212 are explained in more detail in U.S. patent application Ser. No. 08/369,060 entitled IMPROVED INJECT/EJECT SYSTEM FOR RACK MOUNTED PLUG-IN MODULES by Arnold Joslin, which is hereby incorporated by reference for all that it teaches. In a preferred embodiment, top cover 260 of terminal block 210 will include depressions 244 such that terminal block 210 will be able to mount to modules that include inject/eject levers 242.

Figure 6:
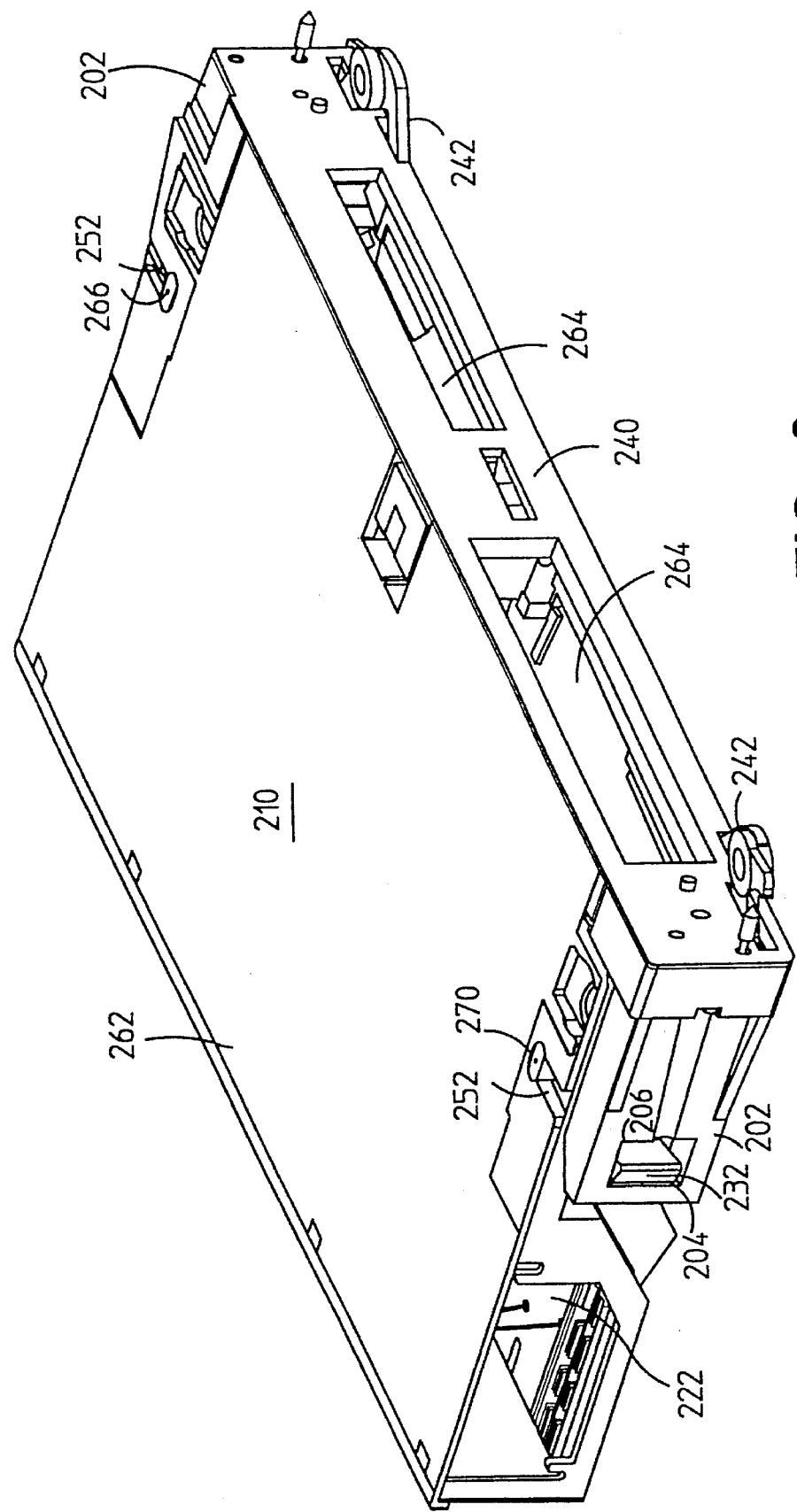
FIG. 6 shows a bottom side, perspective view of a terminal block according to the present invention.

FIG. 6 shows a bottom side perspective view of terminal block 210, illustrating bottom cover 262. FIG. 6 also illustrates terminal block 210 in a fully mated position with front panel 240 having holes 264 for connectors 214. In the mated position, ledge 232 engages insertion bearing surface 204 of insertion guide 202, which is fixedly attached to front panel 240.

Figure 7:
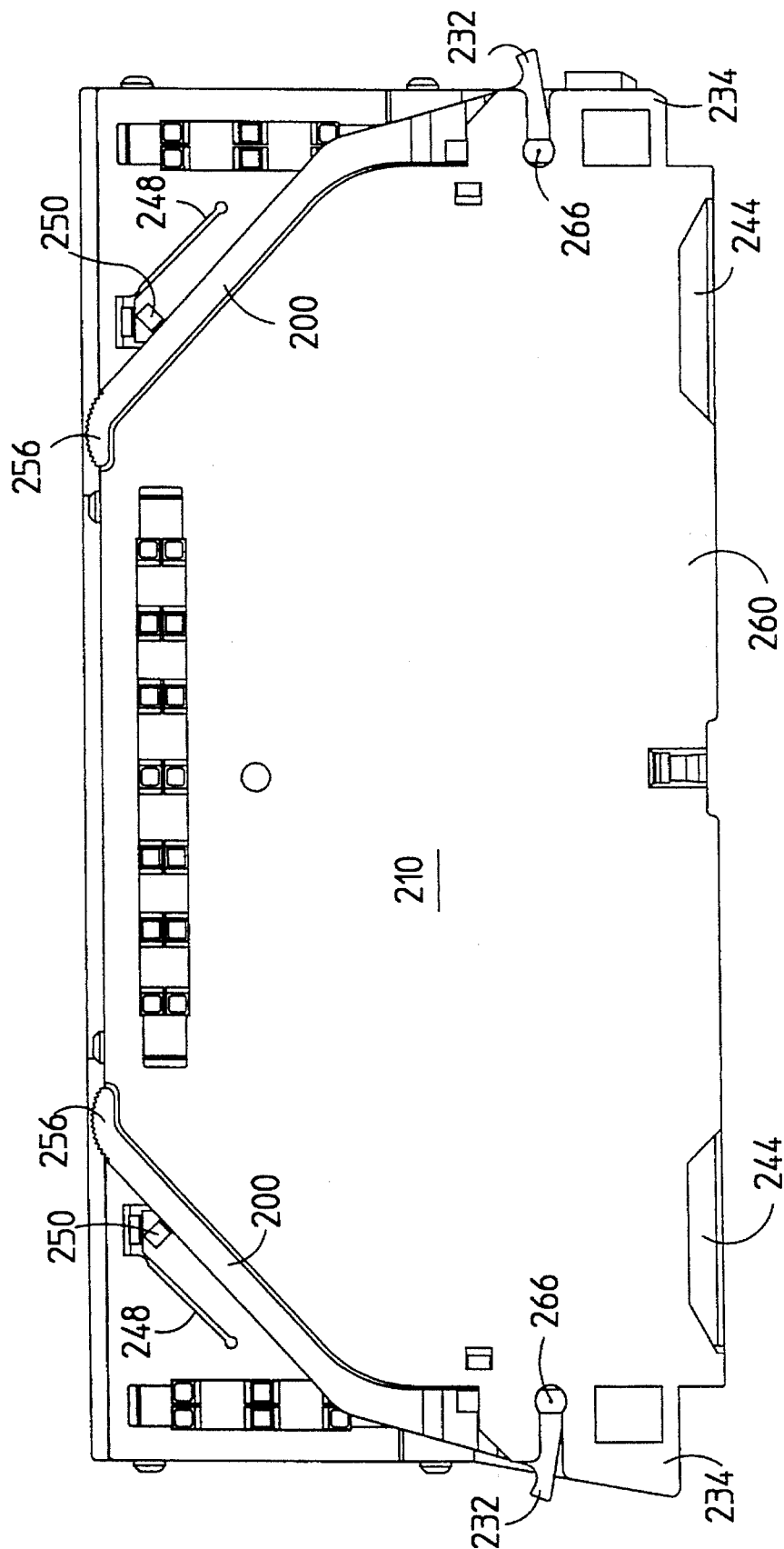
FIG. 7 shows a top view of a terminal block according to the present invention.

FIG. 7 illustrates a top view of terminal block 210, showing levers 200 locked into place on top cover 260 by locking members 250. FIG. 7 also shows different views of such features as lever ledges 232, lever rotation axis members 266, depressions 244 for receiving inject/eject levers of module 212, grasping members 256, and slots 248 around locking members 250.

Figure 8:
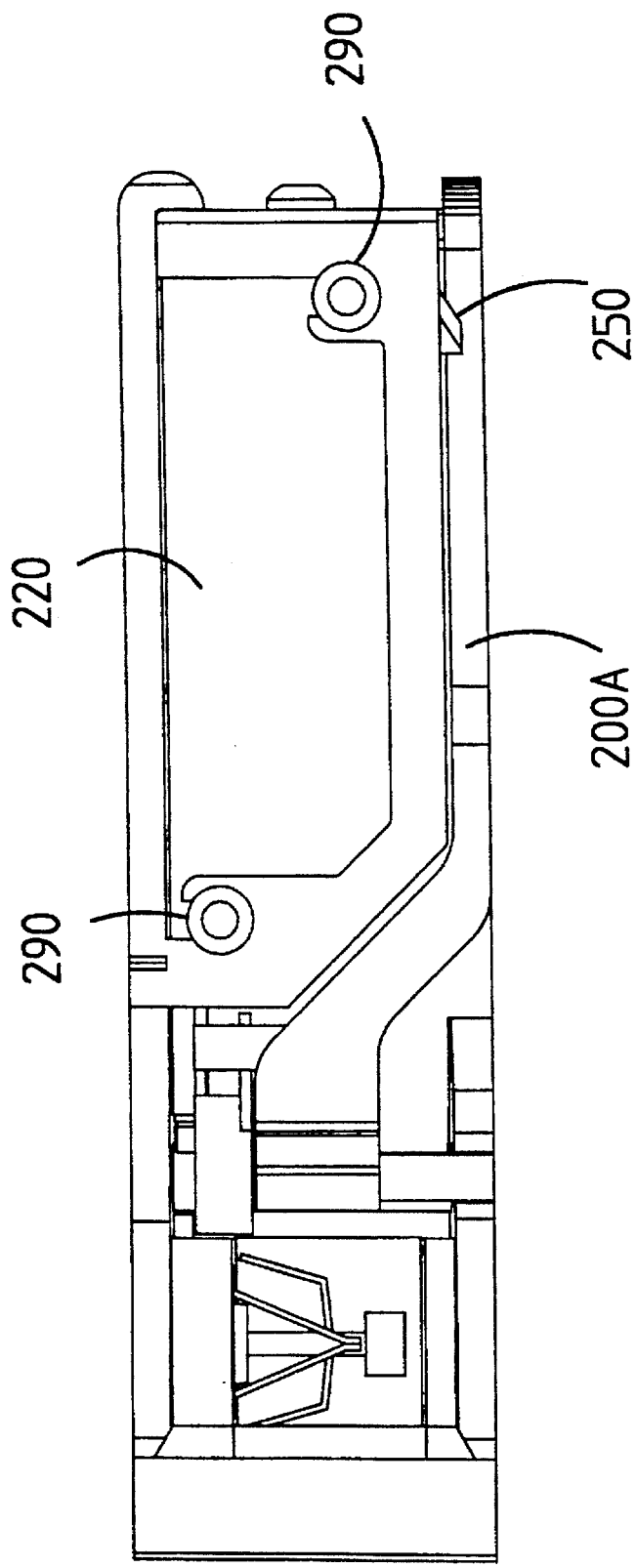
FIG. 8 shows a first side view of a terminal block according to the present invention.
Figure 9:
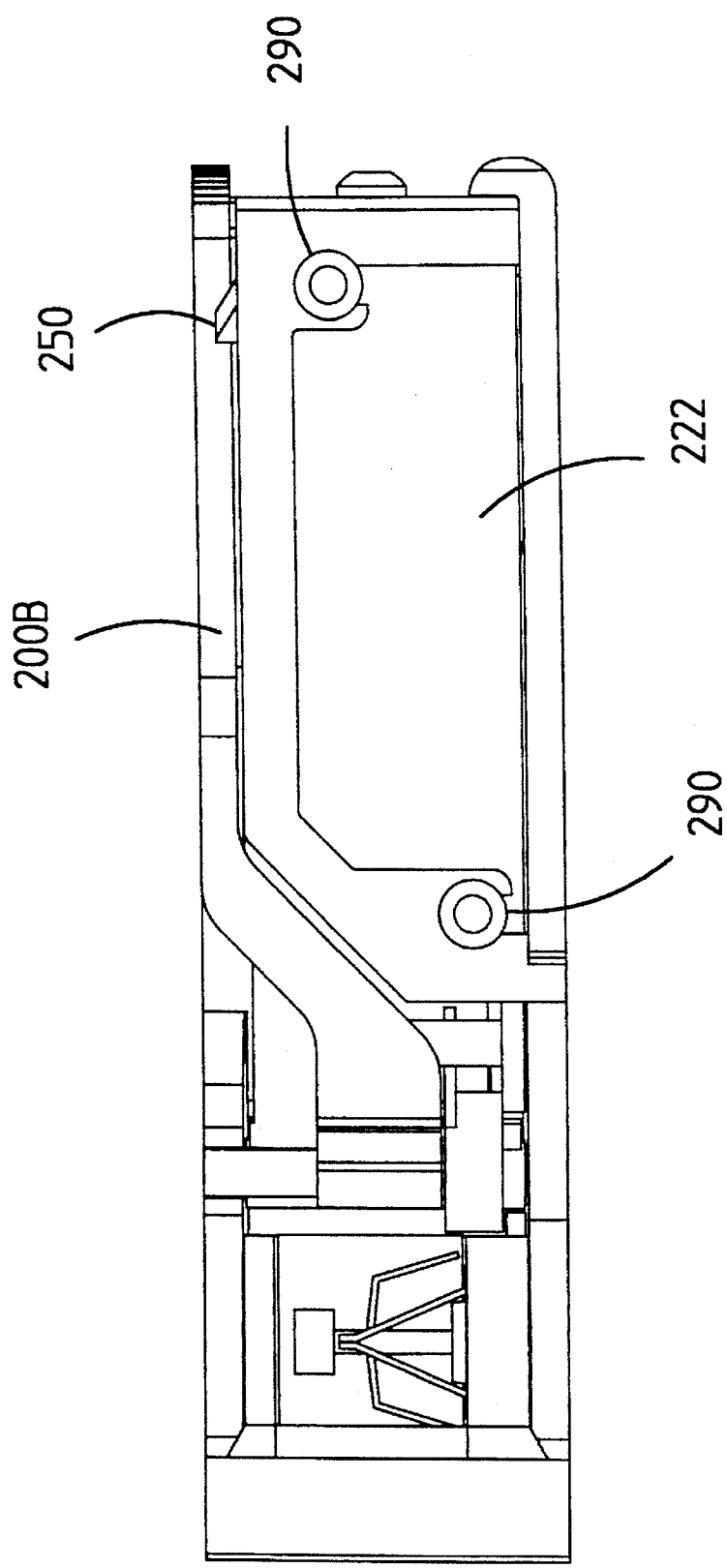
FIG. 9 shows a second side view of a terminal block according to the present invention.
Figure 10:
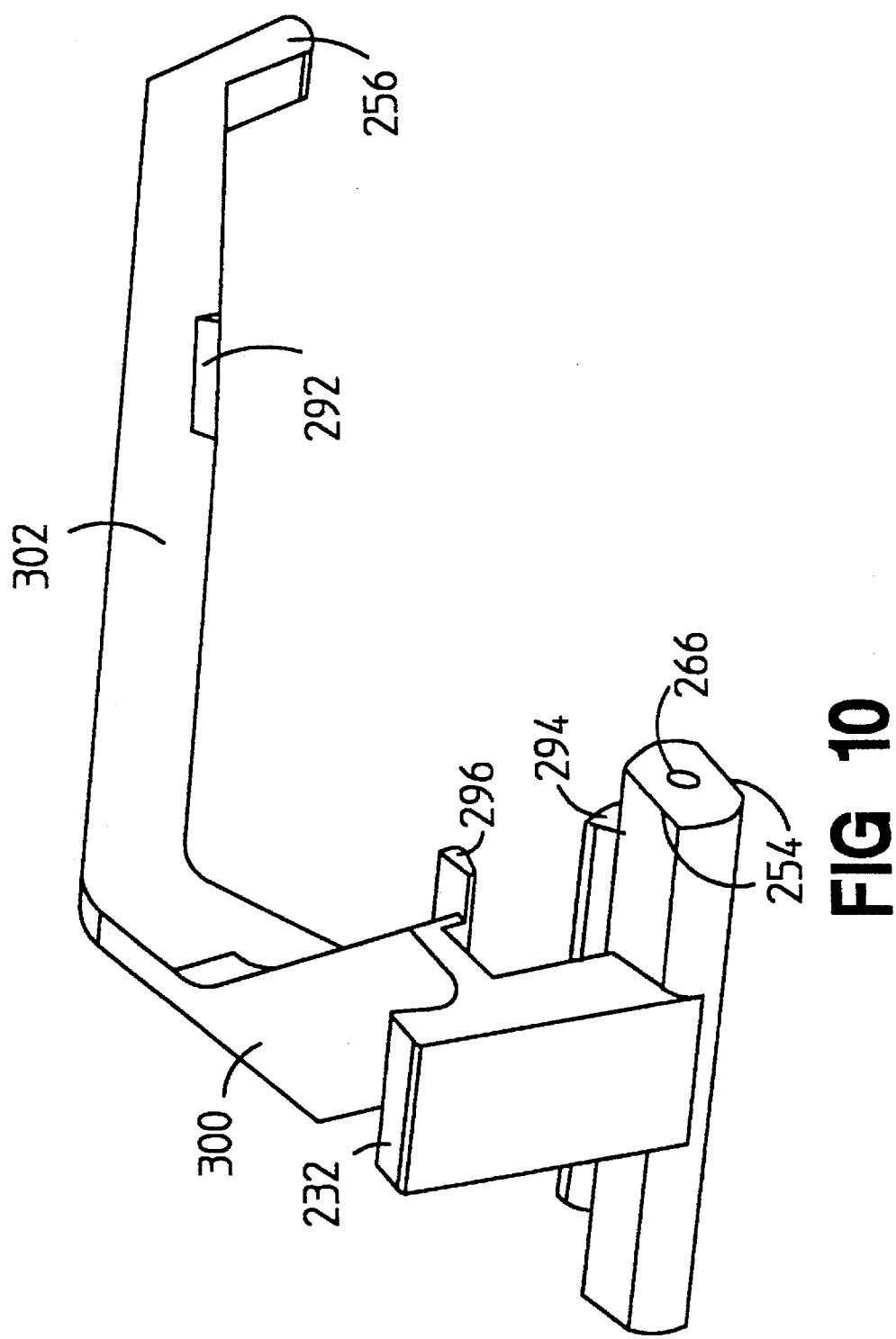
FIG. 10 shows a front, first side perspective view of a lever according to the present invention.
Figure 11:
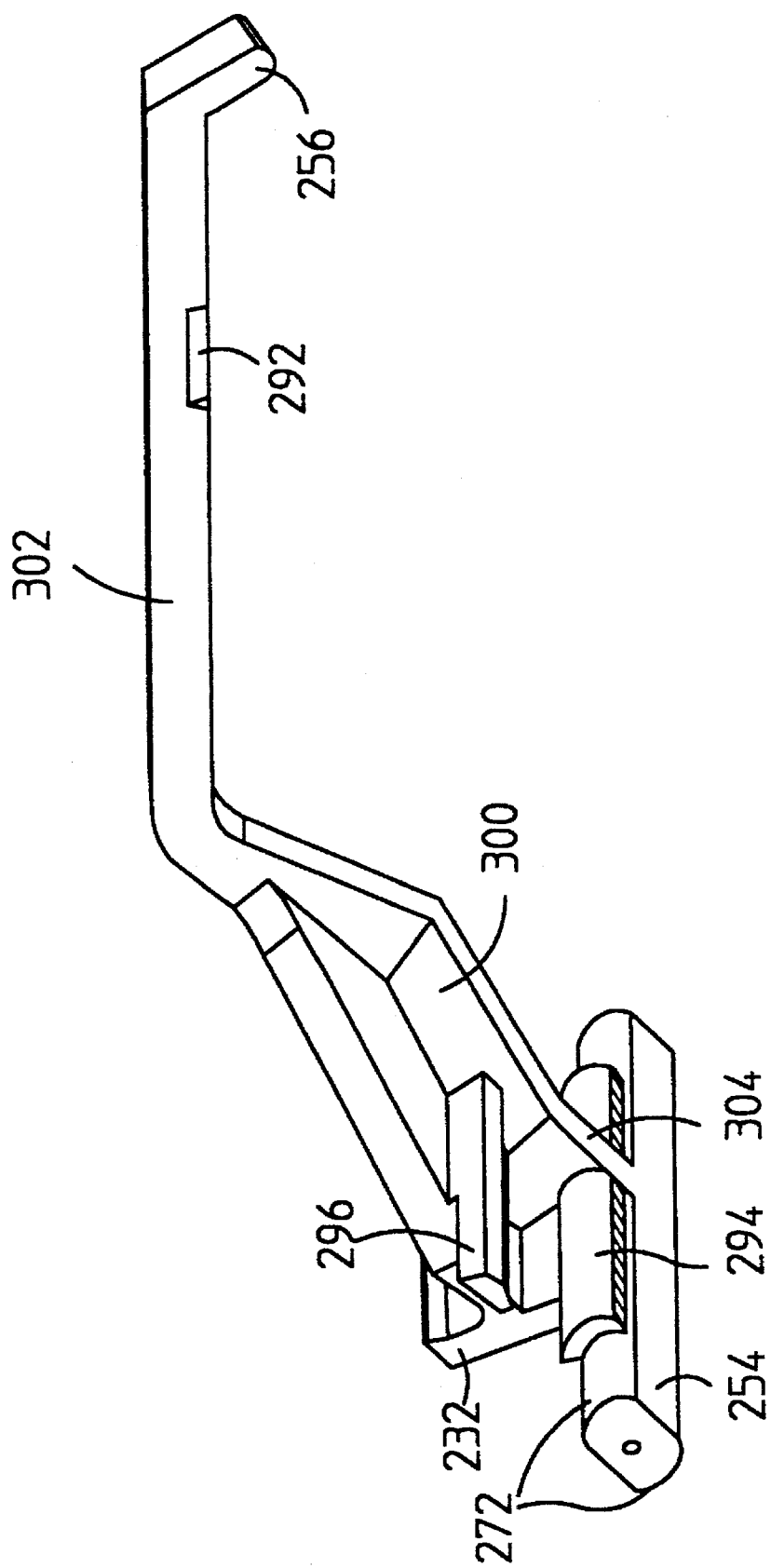
FIG. 11 shows a back, first side perspective view of a lever according to the present invention.
Figure 12:
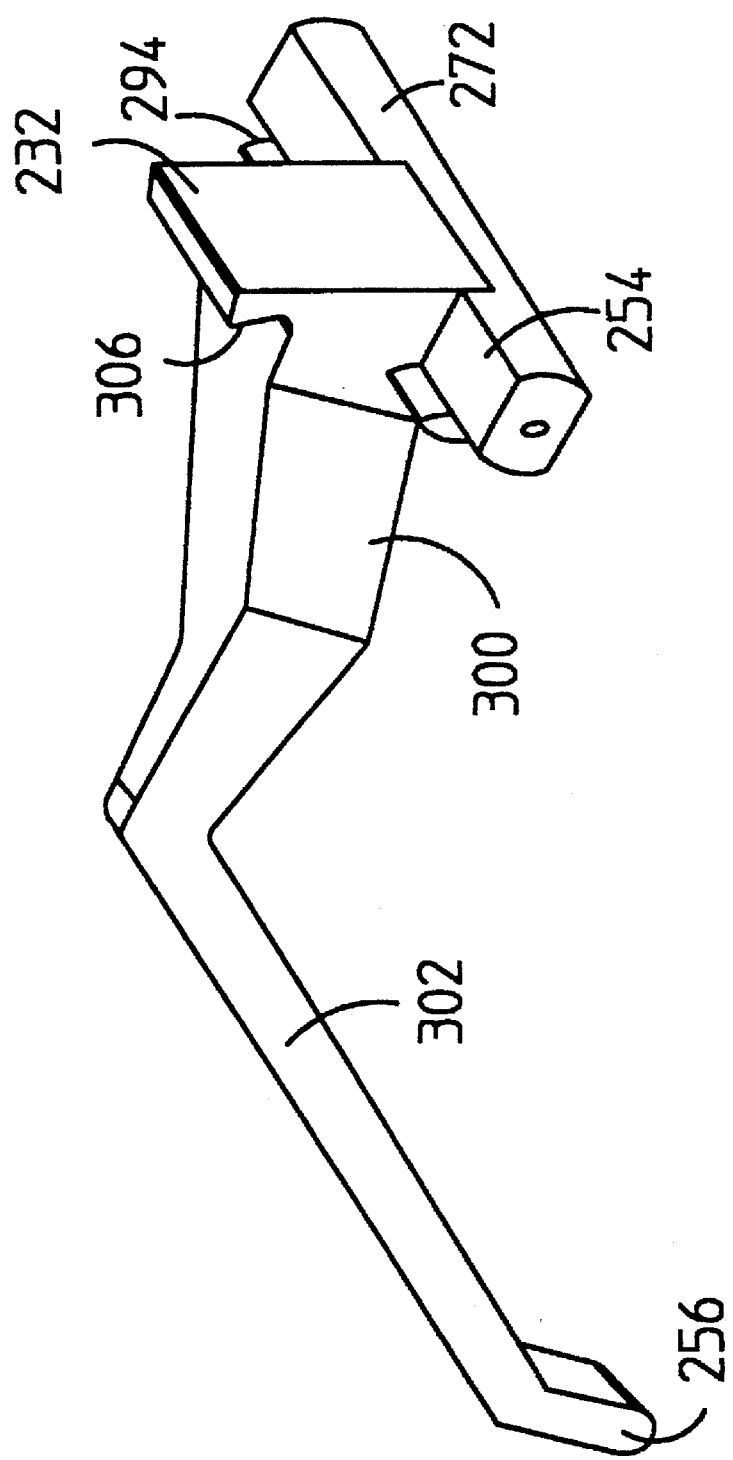
FIG. 12 shows a front, second side perspective view of a lever according to the present invention.
Figure 13:
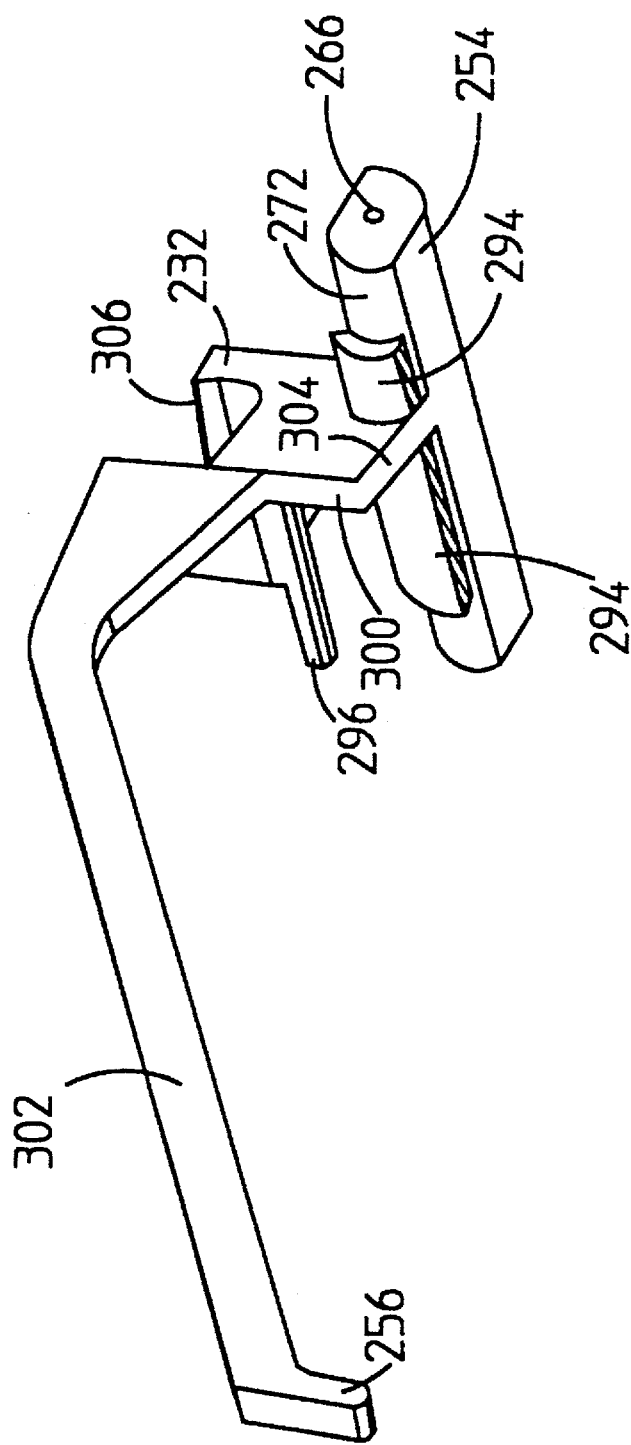
FIG. 13 shows a back, second side perspective view of a lever according to the present invention.

FIGS. 8 and 9 show respective top and bottom views of terminal block 210, illustrating the manner in which levers 200 are shaped in order to avoid obstructing the top and bottom surfaces of the housing to terminal block 210, hence permitting the top and bottom surfaces to be utilized for cable routing apertures 220 and 222, respectively. It should be noted that in FIGS. 8 and 9, cable routing apertures 220 and 222 are covered with aperture shields, which are secured in place at 290 by screws, rivets or similar known fastening means. FIGS. 8 and 9 also show a different perspective view of how ramped locking members 250 hold levers 200 in a locked position.

FIGS. 10–13 show various perspective views of lever 200B illustrating rotational axis member 266 having two opposing flat sides 254 that run along the axis and two opposing curved sided 272 that run along the axis. Curved beam member 294 holds lever 200 in place between top cover 260 and bottom cover 262 when rotational axis member 266 is positioned within slot 252.

The manner in which lever 200 is able to avoid interfering with top and bottom cable routing apertures 220 and 222 can be appreciated in FIGS. 10–13. Specifically, a beam member 304 extends from rotational axis member 266 substantially perpendicular to the axis of rotation and substantially parallel to the two flat sides 254 of rotational axis member 266. Beam member 304 then takes approximately a 45 degree turn from being perpendicular to the axis of rotation at 300 in order to avoid the wire exit areas 220 and 222, while remaining substantially parallel to the flat sides 254 of rotational axis member 266. Beam member 300 traverses this path until it reaches the corner between the side and the top cover of housing 210, at which point it turns the corner and becomes lever arm 302, which is substantially perpendicular to the axis of rotation and approximately 45 degrees from being parallel to flat sides 254.

Also seen in FIGS. 10–13 is ledge 232, which preferably has a slight lip 306 for engaging insertion bearing surface 204 of insertion guide 202. Grasping member 256 can been seen from several different angles as well.

Another optional feature for an improved embodiment is torsion spring beam 296, which can be used to connect a torsion spring (not shown) to lever 200, such that when ramp locking member 250 is depressed and lever 200 is released from the fully locked position, lever arm 200 will rotate slightly to enable an operator to insert his/her finger under grasping member 256. The torsion spring would also maintain the levers in an opened position (as seen in FIG. 2), which would enable the lever ledges 232 to actively engage insertion bearing surfaces 204 of insertion guides 202 when an operator slides the terminal block onto the insertion guides during the insertion process.

Yet a further optional feature for an improved embodiment is ramp 292 on lever arm 302. Ramp 292 would be positioned on the side of lever arm opposite ramp locking member 250 and would fit snugly into a corresponding cut-out (not shown) in the step in terminal block top 260, such that when lever 200 is in the locked position, ramp locking member 250 would prevent lever 200 from moving in a plane parallel to terminal block cover 260 and ramp 292 would prevent lever 200 from moving in a plan perpendicular to terminal block cover 260 and interfering with any immediate neighbor terminal blocks or printed circuit modules.

Figure 14:
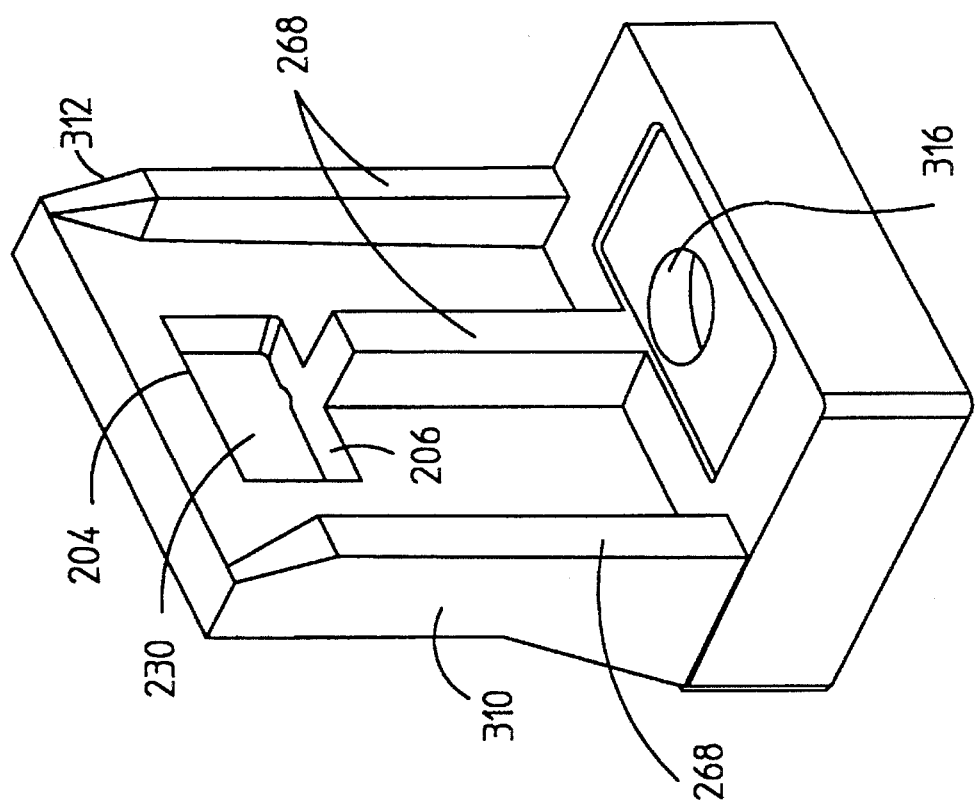
FIG. 14 shows a perspective view of a first, keyed insertion guide according to the present invention.
Figure 15:
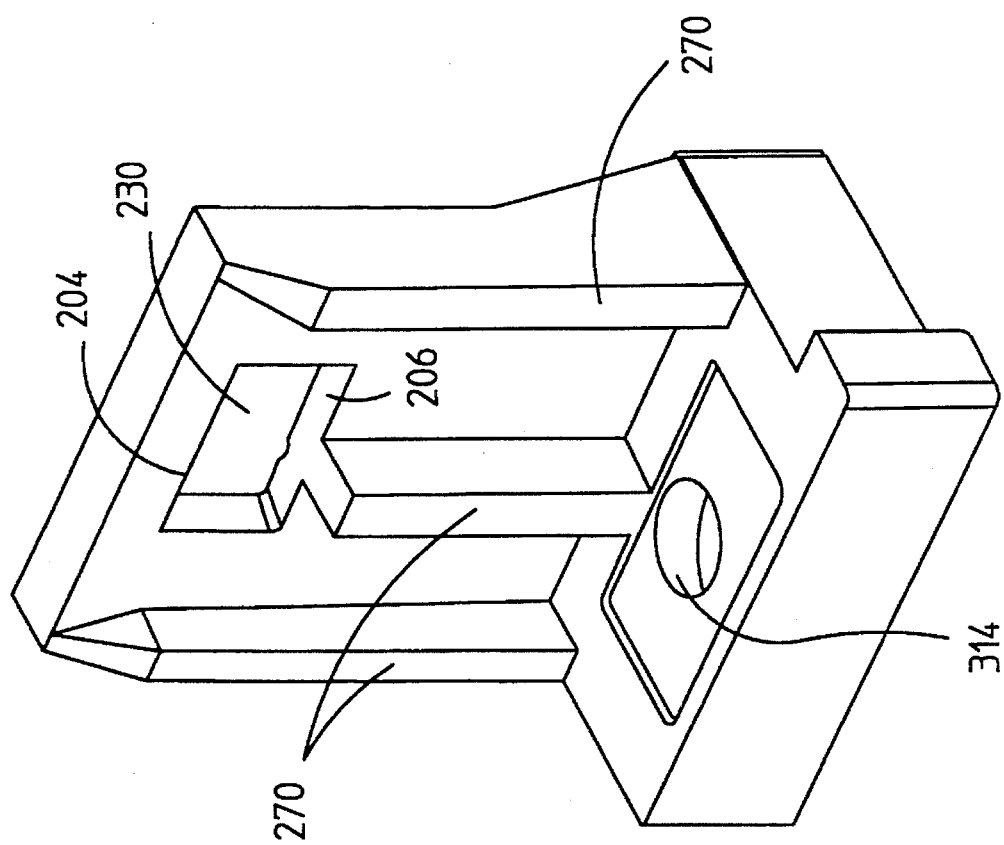
FIG. 15 shows a perspective view of a second, keyed insertion guide according to the present invention.

FIGS. 14 and 15 show blown-up views of a top insertion guide 202A and a bottom insertion guide 202B. These views illustrate keyed guide features 268 and 270, that matingly correspond to slots in the terminal block cover, which prevent the terminal block 210 from being inadvertently mounted onto module 212 upside down. Insertion guides 202A and 202B have holes 314 and 316 for fixedly attaching the insertion guides to opposite ends of front panel 240 by means of screws, rivets or other similar mounting fixtures. FIGS. 14 and 15 also illustrate slots 230 having insertion bearing surfaces 204 and ejection bearing surfaces 206.

Terminal block 210 is preferably manufactured in two separate pieces (top 260 and bottom 262) by a plastic injection molding process and the two pieces attached by screws, rivets or other similar known mounting means. Terminal block 210 may, however, be made of any similarly hard material and by laser machining, stereolithography, die cast or other known machining methods. Lever 200 and insertion guides 202 can be made of any hard metal, such as steel, aluminum, etc. However, in a preferred embodiment, lever 200 is made of metal injected molded stainless steel. Also, in order to prevent galling, lever 200 and insertion guides 202 are preferably not the made of the same material.

The foregoing description of the present invention has been presented for purposes of illustration and description. It is not intended to be exhaustive or to limit the invention to the precise form disclosed, and other modifications and variations may be possible in light of the above teachings. The invention can be made using materials and dimensions that differ from the exact materials, design and dimensions given above without deviating from the essence of the invention. For example, the insertion guides can be manufactured as integral elements of the front panel or the terminal block could be manufactured in more than two pieces and then assembled by any known method. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A terminal block for electrically connecting signal inputs and outputs from a module in an electronics mainframe to external devices, said terminal block comprising:
   a terminal block electrical connector for electrically connecting to an corresponding electrical connector in said module;
   a terminal block housing unit for housing said terminal block electrical connector and for routing wires from said terminal block electrical connector to said external devices, said terminal block housing unit having a top side and a bottom side, a front side and a back side, and a first side and a second side, said terminal block electrical connector being fixedly mounted in said front side of said terminal block housing unit;
   at least one lever for providing leverage against a leverage bearing surface on said module when said terminal block electrical connector is mated to or de-mated from said electrical connector of said module, said at least one lever being mounted either along said first side or said second side; and
   at least one wire routing aperture in either said back side, said first side or said second side.

2. The terminal block according to claim 1 wherein said at least one lever is bent to wrap from said first or said second side of said terminal block housing unit to said top side of said terminal block housing unit in such a manner as to permit a wire routing aperture on said first side and said second side of said terminal block housing unit.

3. The terminal block according to claim 2 wherein said top side of said terminal block housing unit includes at least one locking member for locking said at least one lever into place when said terminal block electrical connector is fully mated with said electrical connector of said module.

4. The terminal block according to claim 3 wherein said locking member further comprises a quick release mechanism for enabling an operator to quickly release said at least one lever.

5. The terminal block according to claim 4 and further comprising at least one torsion spring for maintaining said at least one lever in a predefined position when said lever is unlocked.

6. A system for mating at least one electrical connector of a terminal block to at least one electrical connector of a module, said system comprising:
   a terminal block housing unit for housing said at least one terminal block electrical connector and for routing wires from said at least one terminal block electrical connector to external devices, said terminal block housing unit having a top side and a bottom side, a front side and a back side, and a first side and a second side, said at least one terminal block electrical connector being fixedly mounted in said front side of said terminal block housing unit;

a front panel fixedly mounted to said module, said at least one electrical connector of said module being fixedly mounted in said front panel;

at least one alignment guide fixedly mounted on said front panel of said module, wherein said terminal block housing unit is slid along said at least one alignment guide when said at least one electrical connector of said terminal block is mated with said at least one electrical connector of said module;

at least one insertion bearing surface on said alignment guide;

at least one ejection bearing surface on said alignment guide;

at least one lever rotatably mounted on said terminal block housing unit for engaging said insertion bearing surface on said alignment guide when said terminal block electrical connector is mated to electrical connector of said module and engaging said ejection bearing surface on said alignment guide when said terminal block electrical connector is de-mated from said electrical connector of said module, said at least one lever being mounted either along said first side or said second side; and at least one wire routing aperture in either said back side, said first side or said second side.

7. The system according to claim 6 wherein said at least one lever is bent to wrap from said first or said second side of said terminal block housing unit to said top side of said terminal block housing unit in such a manner as to permit a wire routing aperture on said first side and said second side of said terminal block housing unit.

8. The system according to claim 7 wherein said top side of said terminal block housing unit includes at least one locking member for locking said at least one lever into place when said terminal block electrical connector is fully mated with said electrical connector of said module.

9. The system according to claim 8 wherein said locking member further comprises a quick release mechanism for enabling an operator to quickly release said at least one lever.

10. The system according to claim 9 and further comprising at least one torsion spring for maintaining said at least one lever in a predefined position when said lever is unlocked.

11. The system according to claim 6 wherein said at least one alignment guide and said terminal block housing unit are matingly keyed such that when said terminal block housing unit is being slid along said at least one alignment guide during the mating of said electrical connector of said terminal block and said electrical connector of said module, said terminal block housing unit cannot be mounted to said module upside down.

* * * * *

UNITED STATES PATENT AND TRADEMARK OFFICE
CERTIFICATE OF CORRECTION

PATENT NO. : 5,513,079
DATED : 4/30/96
INVENTOR(S) : Robert A. Millard

It is certified that error appears in the above-indentified patent and that said Letters Patent is hereby corrected as shown below:

In the Claims:

Col. 9, Claim 6, l. 16: Delete "beating" and insert therefor --bearing--

Signed and Sealed this

Twenty-ninth Day of April, 1997

Attest:

BRUCE LEHMAN

*Attesting Officer*   Commissioner of Patents and Trademarks